United States Patent
Yokota et al.

(10) Patent No.: US 10,551,035 B2
(45) Date of Patent: Feb. 4, 2020

(54) PROJECTION OPTICAL SYSTEM AND OBJECT DETECTION DEVICE

(71) Applicants: Motomu Yokota, Aichi (JP);
Hoshibumi Ichiyanagi, Aichi (JP);
Hidenori Miyazaki, Aichi (JP);
Hideyuki Yasugi, Aichi (JP)

(72) Inventors: Motomu Yokota, Aichi (JP);
Hoshibumi Ichiyanagi, Aichi (JP);
Hidenori Miyazaki, Aichi (JP);
Hideyuki Yasugi, Aichi (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 154 days.

(21) Appl. No.: 15/720,594

(22) Filed: Sep. 29, 2017

(65) Prior Publication Data

US 2018/0094793 A1 Apr. 5, 2018

(30) Foreign Application Priority Data

Oct. 4, 2016 (JP) .................................. 2016-196111

(51) Int. Cl.
*H01S 5/40* (2006.01)
*F21V 13/04* (2006.01)
(Continued)

(52) U.S. Cl.
CPC ............ *F21V 13/04* (2013.01); *G01C 15/006* (2013.01); *G01S 7/4815* (2013.01); *G01S 7/4816* (2013.01);
(Continued)

(58) Field of Classification Search
CPC ...... G01S 7/481; G01S 7/4815; H01S 5/4012; H01S 5/4025
See application file for complete search history.

(56) References Cited

U.S. PATENT DOCUMENTS 9,304,228 B2 4/2016 Nakamura et al.
2014/0240977 A1* 8/2014 Hu .................. H01S 5/4012
362/231

(Continued)

FOREIGN PATENT DOCUMENTS

JP 558-085368 U 6/1983
JP H07-183621 A 7/1995
(Continued)

OTHER PUBLICATIONS

Japanese Office Action in corresponding Application No. 2016-196111 dated Sep. 3, 2019 (6 pages).

*Primary Examiner* — Thanh Luu
(74) *Attorney, Agent, or Firm* — Osha Liang LLP (57) ABSTRACT

A projection optical system includes a laser diode; a laser diode module having a plurality of the laser diodes one-line arranged; a light projecting lens to adjust spread of light emitted from the respective laser diodes; and an optical deflector to deflect light passing through the light projecting lens and irradiate a target with the deflected light. The laser diodes emit light such that the light spreads at a first angle in a first direction and spreads at a second angle being wider than the first angle in a second direction being perpendicular to the first direction. The laser diode modules are disposed such that an arrangement direction thereof coincides with the first direction and they are placed along the second direction and shifted in position relative to each other in the first direction. The light projecting lenses are disposed with corresponding to the laser diode modules.

4 Claims, 6 Drawing Sheets

(51) Int. Cl.
 *G01S 17/08* (2006.01)
 *G01S 7/481* (2006.01)
 *G02B 26/10* (2006.01)
 *G02B 19/00* (2006.01)
 *H01S 5/00* (2006.01)
 *G01S 17/42* (2006.01)
 *G01C 15/00* (2006.01)
 *F21Y 115/30* (2016.01)

(52) U.S. Cl.
 CPC .......... *G01S 7/4817* (2013.01); *G01S 17/08* (2013.01); *G01S 17/42* (2013.01); *G02B 19/0014* (2013.01); *G02B 19/0057* (2013.01); *G02B 26/105* (2013.01); *H01S 5/005* (2013.01); *F21Y 2115/30* (2016.08); *H01S 5/4025* (2013.01)

(56) References Cited

U.S. PATENT DOCUMENTS

| 2015/0204977 | A1  | 7/2015 | Sakai |
| 2016/0147025 | A1* | 5/2016 | Sakamoto ............ H01S 5/4012 385/33 |
| 2018/0272538 | A1* | 9/2018 | Takahashi ................ G03B 7/02 |

FOREIGN PATENT DOCUMENTS

| JP | 108-219733 A | 8/1996 |
| JP | H09-232677 A | 9/1997 |
| JP | 2004-146720 A | 5/2004 |
| JP | 2005-049535 A | 2/2005 |
| JP | 2014-032149 A | 2/2014 |
| JP | 2014-154851 A | 8/2014 |
| JP | 2014-235075 A | 12/2014 |
| JP | 2015-137951 A | 7/2015 |
| JP | 2016-115767 A | 6/2016 |

* cited by examiner

FIG. 4B  Enlarged view of portion F

FIG. 6B  C-C cross-sectional view

FIG. 6C  D-D cross-sectional view

FIG. 6D  View from arrow E direction

PROJECTION OPTICAL SYSTEM AND OBJECT DETECTION DEVICE

CROSS-REFERENCE TO RELATED APPLICATION

This application is based on Japanese Patent Application No. 2016-196111 filed with the Japan Patent Office on Oct. 4, 2016, the entire contents of which are incorporated herein by reference.

FIELD

The disclosure relates to a projection optical system having a plurality of laser diodes, and an object detection device including the projection optical system.

BACKGROUND

For example, an object detection device such as a laser radar for vehicle mounting includes a projection optical system that projects light; a light receiving optical system that receives light projected and reflected off a target; and the like.

As disclosed in JP H07-183621 A, JP 2014-32149 A, JP 2014-235075 A, JP 2015-137951 A, JP 2004-146720 A, JP H09-232677 A, JP 2014-154851 A, and JP 2016-115767 A, a projection optical system includes laser diodes which are light sources and optical components such as a light projecting lens that adjusts the spread of light emitted from the laser diodes. A light receiving optical system includes a light receiving element that receives light projected from the projection optical system and reflected off a target, and the like.

In addition, as disclosed in JP 2014-32149 A, JP 2014-235075 A, and JP 2015-137951 A, there are also a projection optical system and a light receiving optical system that include an optical deflector that deflects light having passed through a light projecting lens and projects the deflected light onto a target, and deflects light reflected from the target and allows the deflected light to enter a light receiving element.

An object detection device determines whether there is a target, based on a light reception signal outputted from a light receiving element. In addition, there is also an object detection device that detects a distance from the object detection device to a target based on, for example, a period of time from when laser diodes emit light until a light receiving element receives light reflected from a target.

For example, to expand a target detection range or to improve detection accuracy, plural laser diodes are used as light sources. There is also a module in which a plurality of laser diodes is arranged in one direction (e.g., JP H07-183621 A, JP 2015-137951 A, JP 2004-146720 A, JP H09-232677 A, JP 2014-154851 A, and JP 2016-115767 A). In addition, there is also one in which such plural laser diode modules are stacked on top of each other in one direction (e.g., JP 2004-146720 A, JP 2014-154851 A, and JP 2016-115767 A). Furthermore, there is also a laser diode module including a cooling structure to cool heat generated from laser diodes (e.g., JP 2004-146720 A, JP H09-232677 A, JP 2014-154851 A, and JP 2016-115767 A).

In JP 2014-32149 A, JP 2014-235075 A, and JP 2015-137951 A, plural laser diodes are disposed side by side in an up-down direction (e.g., an up-down direction of a vehicle body) perpendicular to a direction in which an optical deflector deflects and scans light.

Some laser diodes have a characteristic in which emitted light spreads out at a narrow angle in one direction and spreads out at a wide angle in a direction perpendicular to the one direction within a plane perpendicular to an optical axis of the emitted light (e.g., JP 2014-32149 A).

When plural laser diodes or plural laser diode modules are used as light sources, if the laser diodes or the laser diode modules are disposed in a row in one direction such as an up-down direction, a projection optical system or an object detection device increases in size in the one direction.

SUMMARY

An object of the disclosure is to achieve miniaturization of a projection optical system and an object detection device that include a plurality of laser diodes or laser diode modules.

A projection optical system according to one or more embodiments of the disclosure includes a laser diode, the laser diode being a light source; a laser diode module having a plurality of the laser diodes arranged in a row; a light projecting lens configured to adjust spread of light emitted from each of the laser diodes; and an optical deflector configured to deflect light passing through the light projecting lens and irradiate a target with the deflected light. In addition, an object detection device according to one or more embodiments of the disclosure includes, in addition to the above-described projection optical system, a light receiving element configured to receive light projected from the optical deflector and reflected off the target, and detects whether there is the target, based on a light reception signal outputted from the light receiving element. Then, the laser diodes emit light such that the light spreads out at a first angle in a first direction and spreads out at a second angle in a second direction, the second angle being wider than the first angle and the second direction being perpendicular to the first direction. A plurality of the laser diode modules is disposed such that an arrangement direction of the laser diodes coincides with the first direction and that the laser diode modules are placed side by side in the second direction and shifted in position relative to each other in the first direction. A plurality of the light projecting lenses is disposed such that the light projecting lenses correspond to the laser diode modules, respectively.

According to the above description, a laser diode module is disposed such that plural laser diodes are placed side by side in a first direction, and such plural laser diode modules are disposed so as to be placed side by side in a second direction perpendicular to the first direction and to be shifted in position relative to each other in the first direction. Hence, the occupied space in the first direction is reduced, enabling to achieve miniaturization of a projection optical system and an object detection device in the first direction, comparing with a case in which plural laser diodes and plural laser diode modules are disposed side by side in the first direction. In addition, the plurality of laser diodes is arranged in a row in the first direction in which the spread angle of light emitted from the laser diodes is narrower than the second direction. Thus, a wide target detection range can be secured not only in the second direction but also in the first direction. Furthermore, a plurality of light projecting lenses is disposed such that the light projecting lenses correspond to the plural laser diode modules, respectively. Thus, the spread of light emitted from each laser diode in each laser diode module can be easily adjusted by a corresponding light projecting lens.

In one or more embodiments of the disclosure, in the above description, a substrate having a front surface and a back surface may be further included, one of the laser diode modules being mounted on the front surface and another one of the laser diode modules being mounted on the back surface. That is, the plurality of laser diode modules may be mounted separately on both surfaces of one substrate.

In addition, in one or more embodiments of the disclosure, in the above description, the plural light projecting lenses may be disposed so as to be placed side by side in the first direction and to be shifted in position relative to each other in the second direction.

According to one or more embodiments of the disclosure, miniaturization of a projection optical system and an object detection device that include a plurality of laser diodes or laser diode modules can be achieved.

DETAILED DESCRIPTION

Embodiments of the disclosure will be described below with reference to the drawings. In the drawings, the identical or equivalent component is designated by the identical numeral. In embodiments of the disclosure, numerous specific details are set forth in order to provide a more through understanding of the invention. However, it will be apparent to one of ordinary skill in the art that the invention may be practiced without these specific details. In other instances, well-known features have not been described in detail to avoid obscuring the invention.

First, an electrical configuration of an object detection device 100 of one or more embodiments of the disclosure will be described with reference to FIG. 1.

Figure 1:
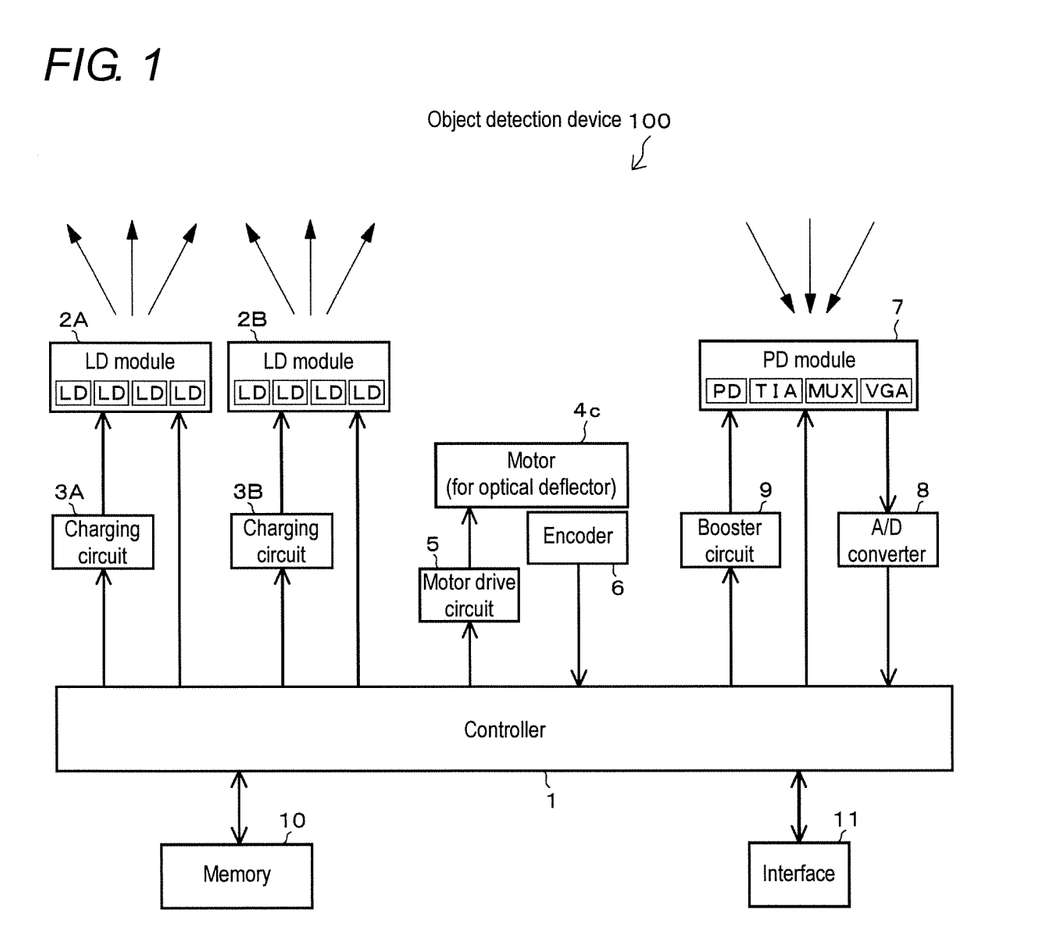
FIG. 1 is an electrical configuration diagram of an object detection device according to one or more embodiments of the disclosure.

FIG. 1 is an electrical configuration diagram of the object detection device 100. The object detection device 100 is a laser radar for vehicle mounting. A controller 1 is composed of a CPU, etc., and controls the operation of each unit of the object detection device 100.

Two laser diode (LD) modules 2A and 2B are provided. Each of the LD modules 2A and 2B is packaged. Each of the LD modules 2A and 2B includes four laser diodes (LDs). Each LD is a light source that emits a high-power optical pulse. Charging circuits 3A and 3B are provided in a one-to-one correspondence with the LD modules 2A and 2B.

The controller 1 allows the charging circuits 3A and 3B to charge each LD in their corresponding LD modules 2A and 2B so that the LDs can emit light. In addition, the controller 1 allows each LD in the LD modules 2A and 2B to emit light to project light onto a target such as a person or an object.

A motor 4c is a drive source for an optical deflector 4 (FIG. 3, etc.) which will be described later. A motor drive circuit 5 drives and rotates the motor 4c. An encoder 6 detects a rotation state (an angle, the number of rotations, etc.) of the motor 4c. The controller 1 allows the motor drive circuit 5 to rotate the motor 4c to control the operation of the optical deflector 4. In addition, the controller 1 detects an operating state (the amount of operation, an operating position, etc.) of the optical deflector 4, based on an output from the encoder 6.

A photodiode (PD) module 7 is packaged. The PD module 7 includes PDs which are light receiving elements, a transimpedance amplifier (TIA), a multiplexer (MUX), and a variable gain amplifier (VGA) (depiction of detailed circuits is omitted). A plurality of (e.g., 32 channels) PDs is provided in the PD module 7. The MUX inputs an output signal from the TIA to the VGA. A booster circuit 9 supplies a boosted voltage which is required for the operation of the photodiodes, to each PD in the PD module 7.

The controller 1 allows the LDs in the LD modules 2A and 2B to emit light, by which the PDs in the PD module 7 receive light reflected off a target. Then, the controller 1 allows the TIA and VGA in the PD module 7 to perform signal processing on a light reception signal which is outputted from the PDs according to the light reception state. Furthermore, the controller 1 allows an A/D converter 8 to convert an analog light reception signal outputted from the PD module 7 into a digital light reception signal, and detects whether there is a target, based on the digital light reception signal. In addition, the controller 1 calculates a period of time from when the LDs emit light until the PDs receive light reflected off the target, and detects a distance from the object detection device 100 to the target, based on the period of time.

A memory 10 is composed of a volatile or nonvolatile memory. In the memory 10 are stored, for example, information for controlling each unit of the object detection device 100 by the controller 1 and information for detecting a target. An interface 11 is composed of a communication circuit such as Ethernet (registered trademark). The controller 1 transmits/receives information about a target or transmits/receives various types of control information to/from an electronic control unit (ECU) mounted on a vehicle, using the interface 11.

Next, the structure and function of the object detection device 100 will be described with reference to FIGS. 2 to 6A to 6D.

Figure 2:
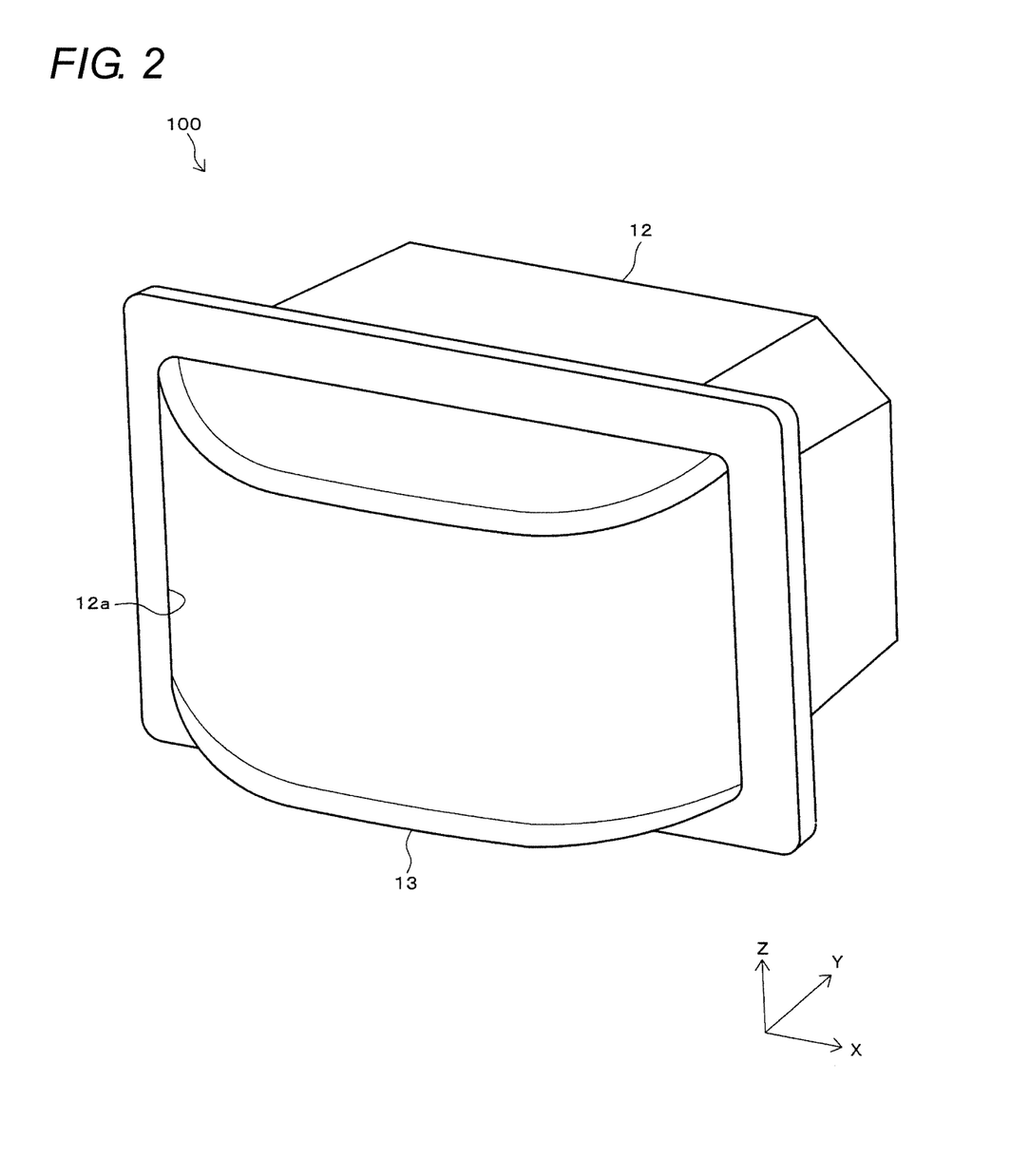
FIG. 2 is a diagram showing an external appearance of the object detection device of FIG. 1.
Figure 3:
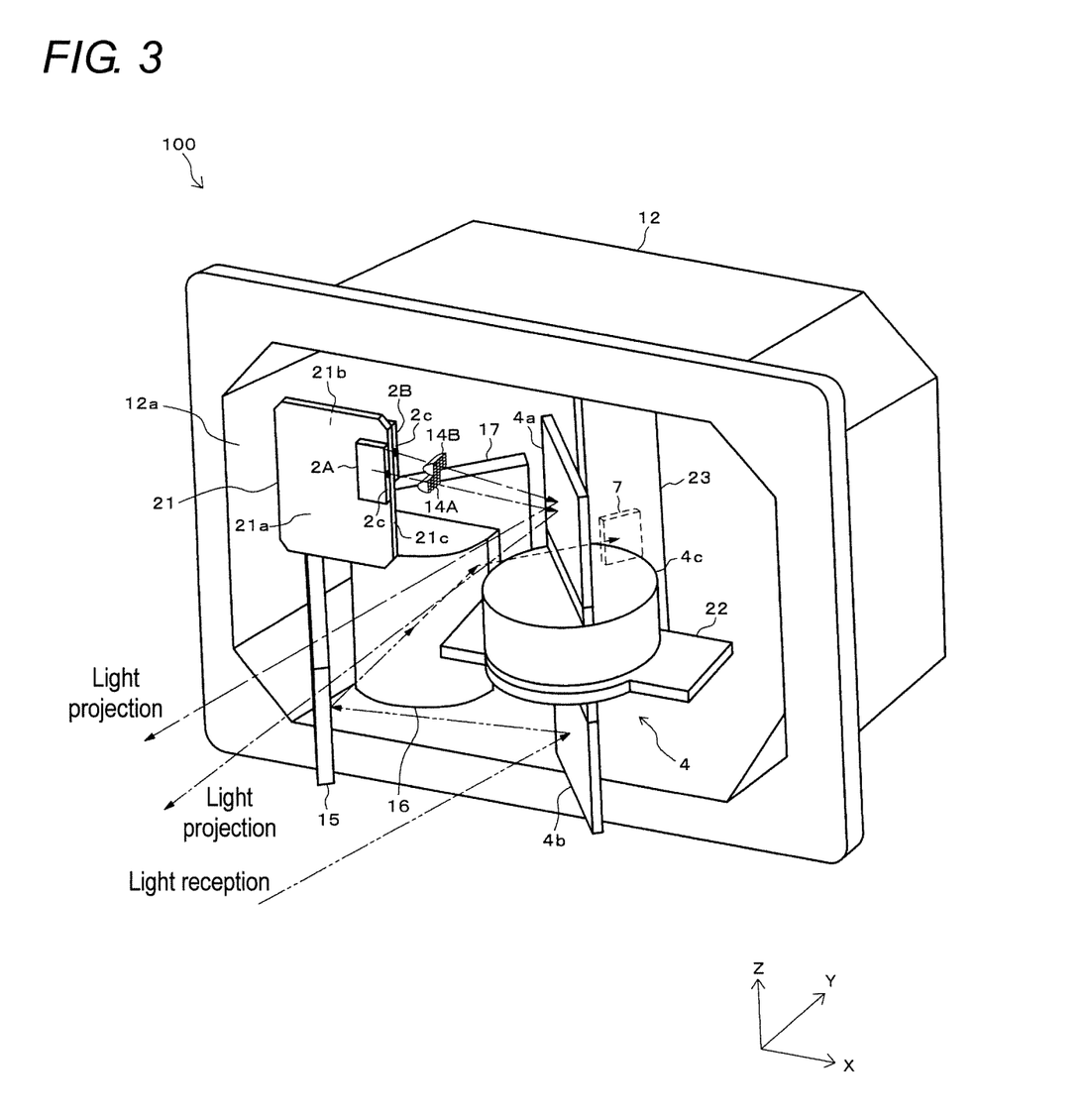
FIG. 3 is a perspective view showing an optical system included in the object detection device of FIG. 1.

FIG. 2 is a perspective view showing an external appearance of the object detection device 100. FIG. 3 is a perspective view showing an optical system included in the object detection device 100.

As shown in FIG. 3, a case 12 of the object detection device 100 is a rectangular box as viewed from the front. As shown in FIG. 2, an opening 12a of the case 12 is covered by a translucent cover 13. The translucent cover 13 is formed in a dome shape with a predetermined thickness.

An internal space enclosed by the case 12 and the translucent cover 13 accommodates the optical system of the object detection device 100 such as that shown in FIG. 3 and an electrical system of the object detection device 100 shown in FIG. 1 (FIG. 3 omits depiction of the electrical system). The translucent cover 13 of FIG. 2 allows light to pass through the inside and outside of the case 12.

The object detection device 100 is installed, for example, at the front, rear, or left and right sides of a vehicle such that the translucent cover 13 faces the front, rear, or left and right sides of the vehicle. At that time, as shown in FIG. 3, the object detection device 100 is installed on the vehicle such that a short-side direction of the case 12 is oriented in an up-down direction Z.

As shown in FIG. 3, the optical system accommodated in the internal space formed by the case 12, etc., includes the LD modules 2A and 2B, light projecting lenses 14A and 14B, the optical deflector 4, reflecting mirrors 15 and 17, a light receiving lens 16, and the PD module 7.

Of the above-described components, the LD modules 2A and 2B, the light projecting lenses 14A and 14B, and the optical deflector 4 form a projection optical system. In addition, the optical deflector 4, the reflecting mirrors 15 and 17, the light receiving lens 16, and the PD module 7 form a light receiving optical system.

Figure 4A:
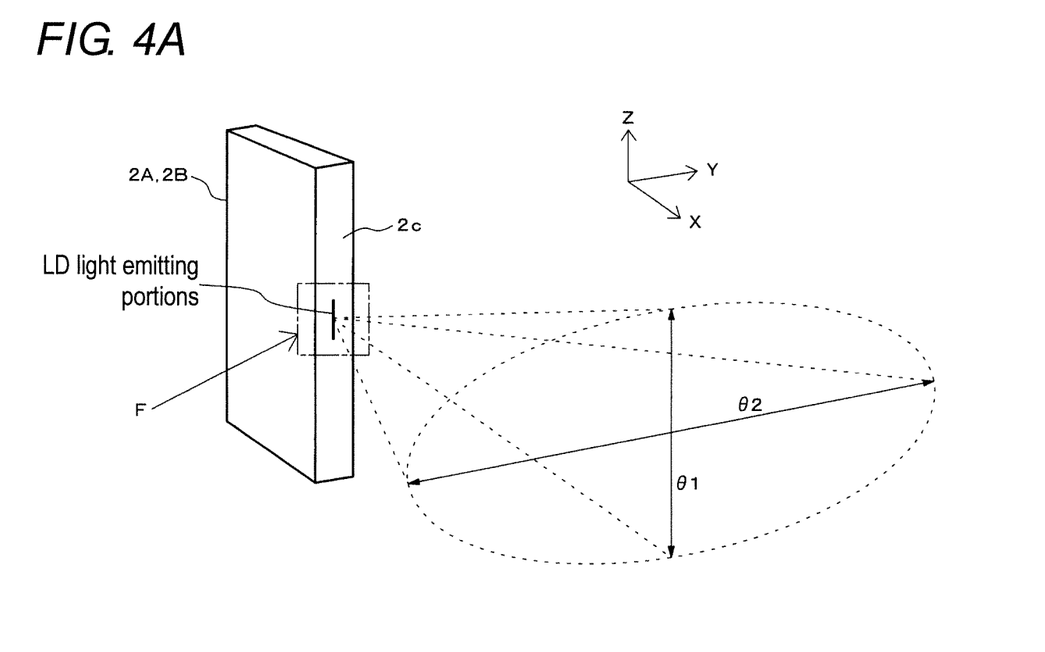
FIGS. 4A and 4B are diagrams showing the details of laser diode (LD) modules of FIG. 3.
Figure 4B:
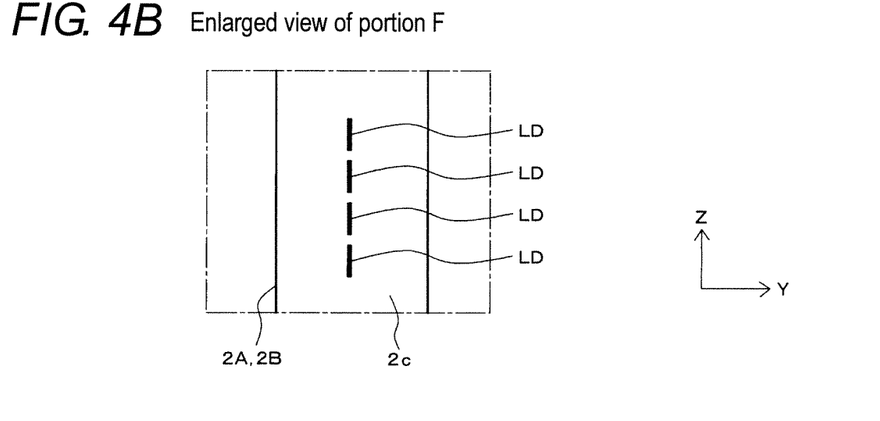

FIGS. 4A and 4B are diagrams showing the details of the LD modules 2A and 2B. FIG. 4B shows an enlarged view of the portion F shown in FIG. 4A.

As shown in FIG. 4A, etc., each of the LD modules 2A and 2B is formed in a thin rectangular-parallelepiped form. One side surface 2c of each of the LD modules 2A and 2B has the light emitting portions of four LDs arranged in a row in the up-down direction Z. Each LD emits light (high-power optical pulse) such that the light spreads out at a first angle $\theta 1$ in a first direction (up-down direction) Z and spreads out at a second angle $\theta 2$ which is wider than the first angle $\theta 1$ in a second direction Y perpendicular to the first direction Z.

Figure 5:
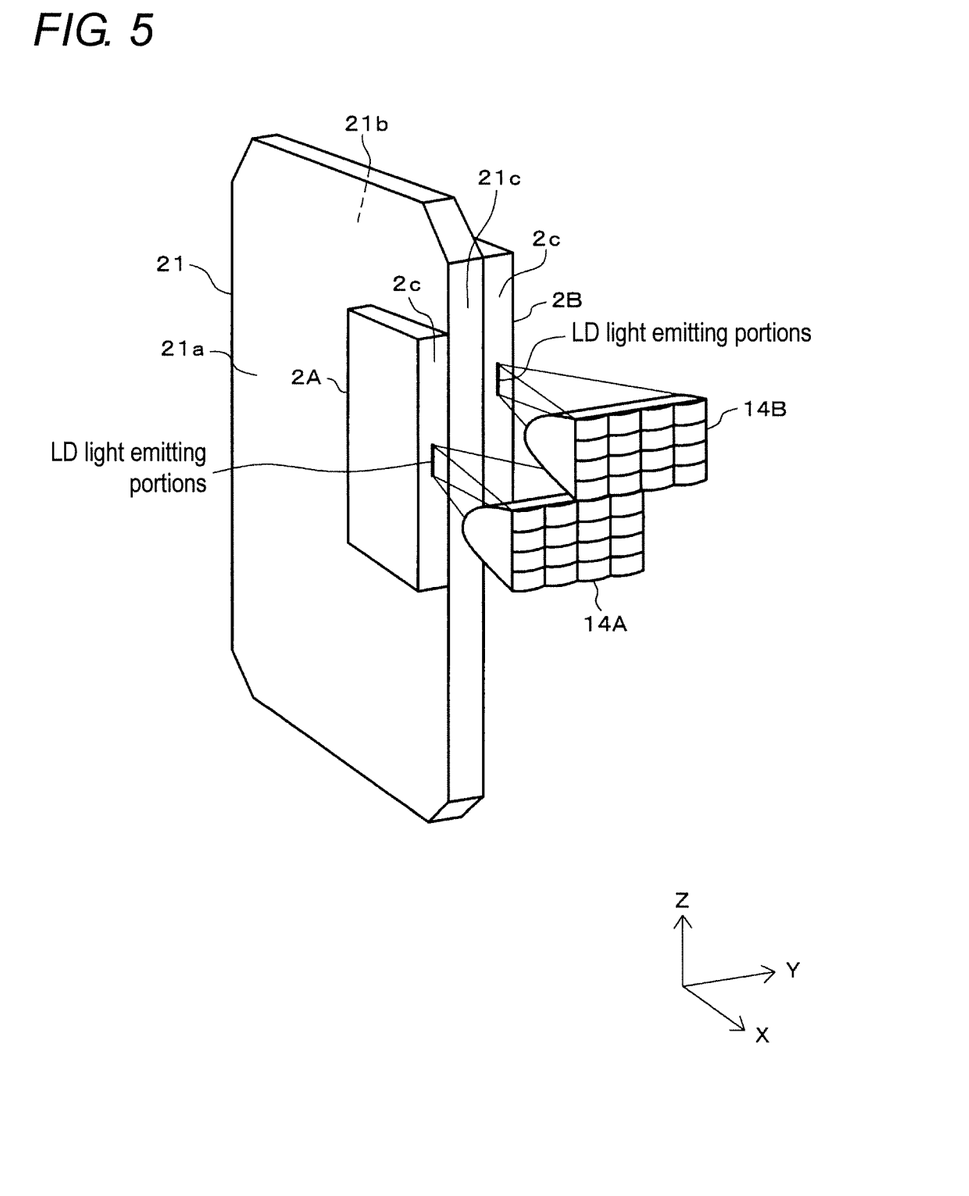
FIG. 5 is an enlarged perspective view of the LD modules and light projecting lenses of FIG. 3.

FIG. 5 is an enlarged perspective view of the LD modules 2A and 2B and the light projecting lenses 14A and 14B of FIG. 3. The LD modules 2A and 2B are mounted separately on both surfaces of one substrate 21. Specifically, the LD module 2A is mounted on a front surface (the opening 12a side of the case 12) 21a of the substrate 21, and the LD module 2B is mounted on a back surface (the inner back side of the case 12) 21b of the substrate 21.

The one side surface 2c of each of the LD modules 2A and 2B from which the light emitting portions of the LDs are exposed is flush with one side surface 21c of the substrate 21. By this, light emitted from the LDs in the LD modules 2A and 2B is prevented from being blocked by the substrate 21.

As shown in FIG. 3, the substrate 21 is fixed within the case 12 such that a boundary between the front surface 21a of the substrate 21 and the one side surface 2c of the LD module 2A and a boundary between the back surface 21b of the substrate 21 and the one side surface 2c of the LD module 2B are parallel to the up-down direction (first direction Z). Hence, the LD modules 2A and 2B are disposed in the case 12 such that the arrangement direction of the LDs coincides with the first direction Z. In addition, the LD modules 2A and 2B are disposed in the case 12 so as to be placed side by side in the second direction Y with the substrate 21 sandwiched therebetween and to be shifted in position relative to each other in the first direction Z (see FIGS. 3 and 5).

In this example, the LD module 2B is disposed in a higher position and more on the inner back side of the case 12 than the LD module 2A. In addition, the light emitting portions of the LDs in each of the LD modules 2A and 2B are also disposed in the same manner.

In front of (light-emitting direction X side) the LD modules 2A and 2B, there are disposed the light projecting lenses 14A and 14B corresponding to the LD modules 2A and 2B, respectively. The light projecting lenses 14A and 14B adjust the spread of light emitted from each LD in the LD modules 2A and 2B.

Figure 6A:
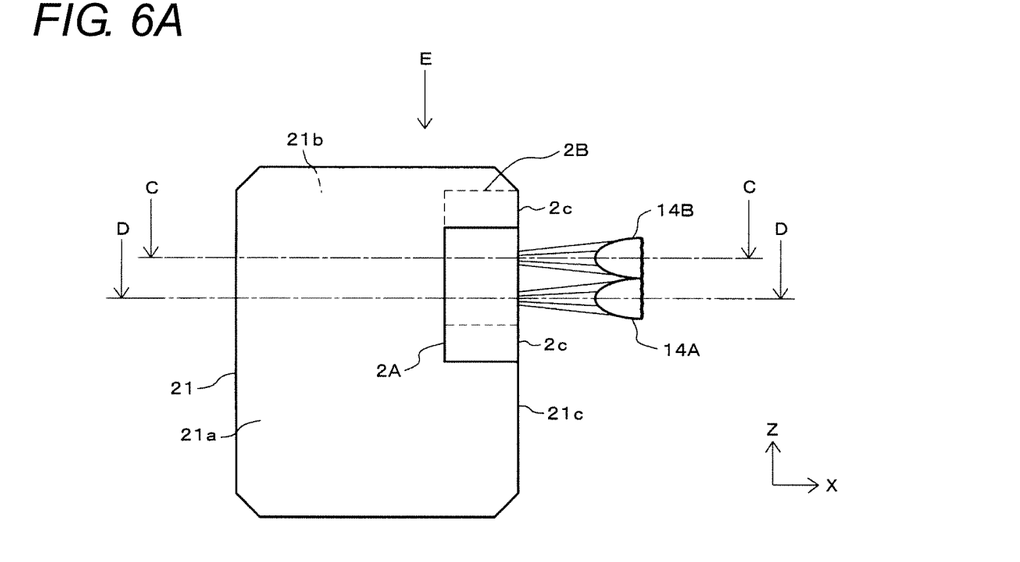
FIGS. 6A to 6D are diagrams showing a positional relationship between the LD modules and the light projecting lenses of FIG. 3.
Figure 6B:
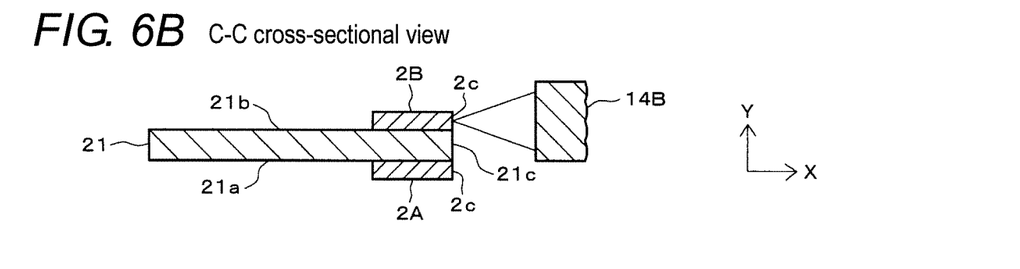
Figure 6C:
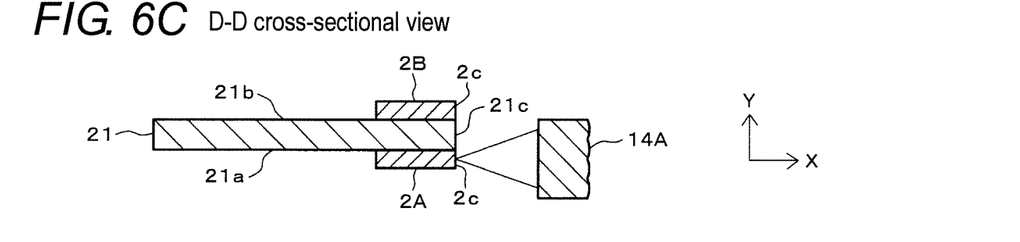
Figure 6D:
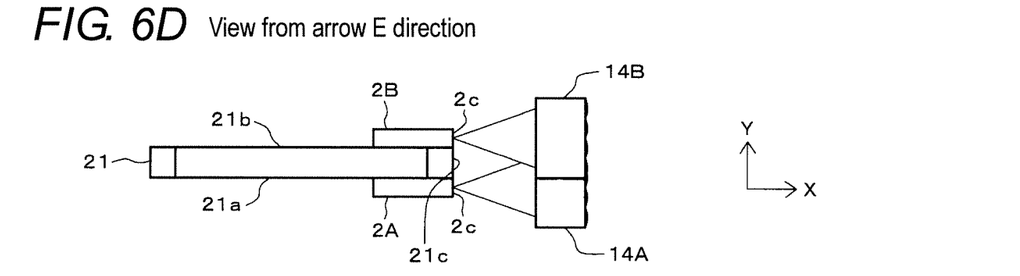

FIGS. 6A to 6D are diagrams showing a positional relationship between the LD modules 2A and 2B and the light projecting lenses 14A and 14B. FIG. 6A is a side view of the LD modules 2A and 2B, the substrate 21, and the light projecting lenses 14A and 14B as viewed from the opening 12a (FIG. 3, etc.) side of the case 12. In addition, FIG. 6B is a C-C cross-sectional view of FIG. 6A, FIG. 6C is a D-D cross-sectional view of FIG. 6A, and FIG. 6D is a view as viewed from the arrow E direction of FIG. 6A.

The C-C cross-section and D-D cross-section of FIG. 6A are parallel to the X direction. The X direction is a horizontal direction. The first direction Z is a direction perpendicular to the X direction. The second direction Y of FIGS. 6B to 6D is a direction perpendicular to the X direction and the Z direction.

As shown in FIGS. 5 and 6A to 6D, the light projecting lenses 14A and 14B are disposed in the case 12 so as to be placed side by side in the first direction Z and to be shifted in position relative to each other in the second direction Y. In this example, the light projecting lens 14B is disposed in a higher position and more on the inner back side of the case 12 than the light projecting lens 14A.

The spread of light emitted from each LD in the LD module 2A is adjusted by the light projecting lens 14A. In addition, the spread of light emitted from each LD in the LD module 2B is adjusted by the light projecting lens 14B.

The optical deflector 4 shown in FIG. 3 includes the motor 4c, a light projecting mirror 4a, and a light receiving mirror 4b. The motor 4c is mounted on a substrate 22. The light projecting mirror 4a and the light receiving mirror 4b each are composed of a double-sided mirror.

The substrate 22 is fixed within the case 12 such that a rotating shaft (not shown) of the motor 4c is parallel to the Z direction. The light projecting mirror 4a is connected to one end (an upper end in FIG. 3) of the rotating shaft of the motor 4c. The light receiving mirror 4b is connected to the other end (a lower end in FIG. 3) of the rotating shaft of the motor 4c. Hence, the light projecting mirror 4a and the light receiving mirror 4b rotate in conjunction with the rotating shaft of the motor 4c.

As indicated by a short-dashed-dotted-line arrow in FIG. 3, the spread of light emitted from the LDs in the LD module 2A is adjusted by the light projecting lens 14A. Thereafter, the light is deflected by the light projecting mirror 4a of the optical deflector 4 and passes through the translucent cover 13 (FIG. 2), and a target is irradiated with the light. In addition, as indicated by a long-dashed-dotted-line arrow in FIG. 3, the spread of light emitted from the LDs in the LD module 2B is adjusted by the light projecting lens 14B. Thereafter, the light is deflected by the light projecting mirror 4a and passes through the translucent cover 13, and the target is irradiated with the light.

At that time, the angle (orientation) of the light projecting mirror 4a is changed by the rotation of the motor 4c, by which light emitted from the LDs is scanned in a range of a predetermined angle within an XY-plane (horizontal plane) outside the translucent cover 13. In addition, light emitted from the LDs in the LD module 2A is projected in a range of a predetermined angle below (ground side) an XY-plane to which the center of the translucent cover 13 belongs. Light emitted from the LDs in the LD module 2B is projected, for example, in a range of a predetermined angle above (sky side) the XY-plane to which the center of the translucent cover 13 belongs.

The reflecting mirror 15 is disposed below the substrate 21 near the opening 12a of the case 12. In the inner back of the case 12 are disposed the light receiving lens 16 and the reflecting mirror 17 in this order so as to be placed side by side with the reflecting mirror 15 in the Y direction. The light receiving lens 16 is composed of a condenser lens. The reflecting mirrors 15 and 17 and the light receiving lens 16 are fixed to the case 12.

In addition, a substrate 23 is disposed in the further inner back of the case 12 than the optical deflector 4. The substrate 23 is fixed to the case 12. The PD module 7 is mounted on a substrate surface of the substrate 23 facing the reflecting mirror 17 side. The PD module 7 includes the above-described PDs, etc. (FIG. 1).

As described above, light having been projected by the projection optical system 2A, 2B, 14A, 14B, 4, and 4a and having passed through the translucent cover 13 is reflected off a target such as a person or an object. Then, the reflected light passes through the translucent cover 13. Thereafter, as indicated by a dashed-double-dotted-line arrow in FIG. 3, the reflected light is reflected off the light receiving mirror 4b of the optical deflector 4 and is further reflected off the reflecting mirror 15 and enters the light receiving lens 16. At that time, the angle (orientation) of the light receiving mirror 4b is changed by the rotation of the motor 4c, by which light reflected off the target is received by the light receiving mirror 4b in a range of a predetermined angle within the XY-plane (horizontal plane) outside the translucent cover 13.

As indicated by a dashed-line arrow in FIG. 3, the reflected light having entered the light receiving lens 16 via the light receiving mirror 4b and the reflecting mirror 15 is collected by the light receiving lens 16 and is thereafter reflected off the reflecting mirror 17 and received by the PDs in the PD module 7. Then, the PD module 7 and the A/D converter 8 perform signal processing on a light reception signal outputted from the PDs according to the light reception state. Thereafter, based on the light reception signal, the controller 1 detects whether there is a target, and calculates a distance from the object detection device 100 to the target.

According to the object detection device 100 and the projection optical system of an illustrative embodiment, each of the LD modules 2A and 2B is disposed such that plural LDs are placed side by side in the first direction (up-down direction) Z, and the two LD modules 2A and 2B are disposed so as to be placed side by side in the second direction Y perpendicular to the first direction Z and to be shifted in position relative to each other in the first direction Z. Hence, the occupied space in the first direction Z is reduced, enabling to achieve miniaturization of the projection optical system and the object detection device 100 in the first direction Z, comparing with a case in which plural LDs and the plural LD modules 2A and 2B are disposed side by side in the first direction Z.

In addition, in an illustrative embodiment, a plurality of LDs is arranged in a row in the first direction Z in which the spread angle of light emitted from the LDs is narrower than the second direction Y. Hence, a wide target detection range can be secured not only in the second direction Y but also in the first direction Z.

In addition, in an illustrative embodiment, the plurality of light projecting lenses 14A and 14B is disposed so that the projecting lenses 14A and 14B correspond to the plural LD modules 2A and 2B, respectively. Hence, the spread of light emitted from each LD in the LD modules 2A and 2B can be easily adjusted by the corresponding light projecting lenses 14A and 14B.

In addition, in an illustrative embodiment, the plurality of LD modules 2A and 2B is mounted separately on both surfaces of the substrate 21. Hence, the LD modules 2A and 2B can be easily positioned on both surfaces of one substrate 21 and can be easily disposed in the projection optical system and the object detection device 100.

Furthermore, in an illustrative embodiment, the plural light projecting lenses 14A and 14B are disposed so as to be placed side by side in the first direction Z and to be shifted in position relative to each other in the second direction Y. Hence, light emitted from each LD in the LD modules 2A and 2B can be easily spread out in the first direction Z by the corresponding light projecting lenses 14A and 14B. In addition, light emitted from each LD can be easily adjusted by the corresponding light projecting lenses 14A and 14B so as to be spread out in a predetermined state.

The disclosure can also adopt various embodiments in addition to an illustrative embodiment. For example, although an illustrative embodiment shows, as an example, a projection optical system provided with two LD modules each including four LDs, the disclosure is not limited thereto. The number of LD modules installed may be three or more. In addition, the number of LDs in each LD module may be two, three, or five or more. Furthermore, three or more light projecting lenses may be provided in accordance with the LD modules.

In addition, although an illustrative embodiment shows an example in which the LD modules 2A and 2B are mounted separately on both surfaces of one substrate 21, the disclosure is not limited thereto. In addition to this, for example, a plurality of LD modules may be mounted on one surface of a substrate or may be installed on a base material other than a substrate. That is, an installation structure of a plurality of LD modules may be selected as appropriate.

In addition, although an illustrative embodiment shows an example in which the light projecting lenses 14A and 14B are disposed so as to be placed side by side in the first direction Z and to be shifted in position relative to each other in the second direction Y, the disclosure is not limited thereto. In addition to this, for example, plural light projecting lenses may be disposed so as to be placed side by side in the second direction Y and to be shifted in position relative to each other in the first direction Z. That is, the positions of a plurality of light projecting lenses are set such that light emitted from plural LD modules can be individually adjusted.

Furthermore, although an illustrative embodiment shows an example in which the disclosure is applied to the object detection device 100 and projection optical system for vehicle mounting, the disclosure can also be applied to object detection devices and projection optical systems for other applications.

While the invention has been described with reference to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:
1. A projection optical system comprising:
a laser diode, the laser diode being a light source;
a laser diode module having a plurality of the laser diodes arranged in a row;
a light projecting lens configured to adjust spread of light emitted from each of the laser diodes; and
an optical deflector configured to deflect light passing through the light projecting lens and irradiate a target with the deflected light, wherein the laser diodes emit light such that the light spreads out at a first angle in a first direction and spreads out at a second angle in a second direction, the second angle being wider than the first angle and the second direction being perpendicular to the first direction, wherein a plurality of the laser diode modules is disposed such that an arrangement direction of the laser diodes coincides with the first direction and that the laser diode modules are placed side by side in the second direction and shifted in position relative to each other in the first direction, wherein a plurality of the light projecting lenses is disposed such that the light projecting lenses correspond to the laser diode modules, respectively, and wherein the plurality of the laser diode modules is mounted separately on both surfaces of one substrate.

2. The projection optical system according to claim 1, wherein the light projecting lenses are disposed so as to be placed side by side in the first direction and to be shifted in position relative to each other in the second direction.

3. An object detection device comprising:
a laser diode, the laser diode being a light source;
a laser diode module having a plurality of the laser diodes arranged in a row;
a light projecting lens configured to adjust spread of light emitted from each of the laser diodes;
an optical deflector configured to deflect light passing through the light projecting lens and irradiate a target with the deflected light; and
a light receiving element configured to receive light projected from the optical deflector and reflected off the target, the object detection device detecting whether there is the target, based on a light reception signal outputted from the light receiving element, wherein the laser diodes emit light such that the light spreads out at a first angle in a first direction and spreads out at a second angle in a second direction, the second angle being wider than the first angle and the second direction being perpendicular to the first direction, wherein a plurality of the laser diode modules is disposed such that an arrangement direction of the laser diodes coincides with the first direction and that the laser diode modules are placed side by side in the second direction and shifted in position relative to each other in the first direction, wherein a plurality of the light projecting lenses is disposed such that the light projecting lenses correspond to the laser diode modules, respectively, wherein the object detection device further comprises a substrate having a front surface and a back surface, and wherein one of the laser diode modules is mounted on the front surface, and another one of the laser diode modules is mounted on the back surface.

4. The object detection device according to claim 3, wherein the light projecting lenses are disposed so as to be placed side by side in the first direction and to be shifted in position relative to each other in the second direction.

* * * * *